(12) United States Patent
Ganesan et al.

(10) Patent No.: US 10,930,362 B2
(45) Date of Patent: Feb. 23, 2021

(54) FLEXIBLE AND EFFICIENT DEVICE TRIM SUPPORT USING EFUSE

(71) Applicant: TEXAS INSTRUMENTS INCORPORATED, Dallas, TX (US)

(72) Inventors: Aravind Ganesan, Bengaluru (IN); Jaiganesh Balakrishnan, Bengaluru (IN); Nagarajan Viswanathan, Bengaluru (IN); Yeswanth Guntupalli, Guntur (IN); Ajai Paulose, Idukki (IN); Mathews John, Bengaluru (IN); Jagannathan Venkataraman, Bengaluru (IN); Neeraj Shrivastava, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/916,911

(22) Filed: Jun. 30, 2020

(65) Prior Publication Data

US 2020/0327950 A1 Oct. 15, 2020

Related U.S. Application Data

(62) Division of application No. 16/235,698, filed on Dec. 28, 2018, now Pat. No. 10,741,268.

(30) Foreign Application Priority Data

Nov. 13, 2018 (IN) .............................. 201841042579

(51) Int. Cl.
*G11C 29/02* (2006.01)
*G11C 17/18* (2006.01)
(Continued)

(52) U.S. Cl.
CPC .......... *G11C 29/028* (2013.01); *G11C 17/146* (2013.01); *G11C 17/16* (2013.01); *G11C 17/18* (2013.01); *G11C 29/027* (2013.01)

(58) Field of Classification Search
CPC ..... G11C 29/028; G11C 17/146; G11C 17/16; G11C 17/18; G11C 29/027
See application file for complete search history.

(56) References Cited

U.S. PATENT DOCUMENTS 6,380,935 B1    4/2002  Heeschen et al.
10,600,496 B1 * 3/2020  Wieduwilt ........... G11C 29/789
(Continued)

*Primary Examiner* — Tri M Hoang
(74) *Attorney, Agent, or Firm* — John R. Pessetto; Charles A. Brill; Frank D. Cimino

(57) ABSTRACT

A one-time write, read-only memory for storing trimming parameters includes an address pointer table, a fixed packet portion, and a flexible packet portion. The fixed packet portion includes one or more fixed packets, each fixed packet including trimming parameters for a component identified for trimming during a design phase. The flexible packet portion includes one or more flexible packets of different types. Each flexible packet includes trimming parameters for a component identified for trimming after the design phase. One packet type includes a length section and a number of fields equal to a value stored in the length section. Each field includes an address, a trimming parameter, and a mask. Another packet type includes trimming parameters associated with operands in operating instructions for a microcontroller, where the operands include an address and a mask.

3 Claims, 3 Drawing Sheets

(51) Int. Cl.
*G11C 17/16* (2006.01)
*G11C 17/14* (2006.01)

(56) References Cited

U.S. PATENT DOCUMENTS

| | | |
|---|---|---|
| 2018/0018274 A1 | 1/2018 | Bradbury et al. |
| 2018/0019946 A1 | 1/2018 | Pappalardo et al. |
| 2018/0159538 A1 | 6/2018 | Pappalardo et al. |
| 2020/0082887 A1* | 3/2020 | Cadloni .............. G06F 12/0246 |

* cited by examiner

FLEXIBLE AND EFFICIENT DEVICE TRIM SUPPORT USING EFUSE

CROSS-REFERENCE TO RELATED APPLICATIONS

This divisional application claims priority to U.S. patent application Ser. No. 16/235,698, filed Dec. 28, 2018, which application claims priority to Indian Provisional Application No. 201841042579, filed Nov. 13, 2018, both of which are hereby incorporated herein by reference in their entirety.

BACKGROUND

Analog integrated circuits (ICs), sensors, and mixed-signal ICs are growing increasingly complex and must meet increasingly higher performance requirements. As a result, very little device variation can be tolerated. However, due to the nature of IC fabrication, device to device variations in components of the design are inevitable. To compensate for this variation and maintain high performance, components are calibrated or trimmed using device dependent trimming parameters. The trimming parameters are stored in a one-time write memory, such as an eFuse memory, and loaded to the appropriate trimming register when the device is powered up.

However, eFuse memories are area intensive, sometimes requiring as much as one square millimeter for 12,000 bits, and oftentimes cannot be adapted after chip manufacture. This means the eFuse memory can only store trimming parameters for components identified for calibration before chip manufacture, at the design phase. If any additional components are identified after chip manufacture, the IC must be returned to the design phase to accommodate the newly identified components. Further, calibration for some components varies according to current device conditions, such as temperature, Nyquist rate, and the like. Thus, trimming parameters for those components must also vary according to current device conditions, further complicating storage of trimming parameters in the eFuse memory.

SUMMARY

Some eFuse memories are organized to include both static and flexible allocation of trimming parameters. The flexible allocation of trimming parameters allows for trimming parameter variation based on current device conditions and storage of trimming parameters to calibrate components identified after chip manufacture, not just during the design phase of the IC. Flexible allocation also uses the limited space of the eFuse memory efficiently to minimize the required size of the eFuse memory. Flexible allocation of trimming parameters within eFuse memories can include an address pointer table, fixed packets of trimming parameters, and flexible packets of trimming parameters. The address pointer table indicates the starting address of fixed packets of trimming parameters for components identified for calibration during the design phase. With the address pointer table to indicate starting addresses, the fixed packets of trimming parameters need not be allotted a uniform amount of space within the memory. Instead, each fixed packet can be a different size and takes up only the memory space it needs. In some examples, the address pointer table also includes the starting address and packet type for flexible packets of trimming parameters for components identified for calibration after chip manufacture.

Several types of flexible packets can be used. One type of flexible packet includes a length section and a number of field sections equal to the value stored in the length section. Each field section includes the address of the appropriate trimming register, the trimming parameter, and the mask needed to align the trimming parameter in the trimming register. Another type of flexible packet includes only trimming parameters and relies on operands provided as input to a microcontroller's firmware to indicate the appropriate trimming register and mask for each trimming parameter. Another type of flexible packet allows trimming parameters to compensate for current device conditions by including fields which describe a model of the trimming parameter. A microcontroller uses the model of the trimming parameter and current device conditions to calculate the appropriate trimming parameter, which it stores in the appropriate trimming register and mask identified in operands provided as input to the microcontroller's firmware. In some cases, the flexible packet types include a second mask to compensate for default inversion between analog and digital components within the IC.

BRIEF DESCRIPTION OF THE DRAWINGS

For a detailed description of various examples, reference will now be made to the accompanying drawings in which.

DETAILED DESCRIPTION

Figure 1:
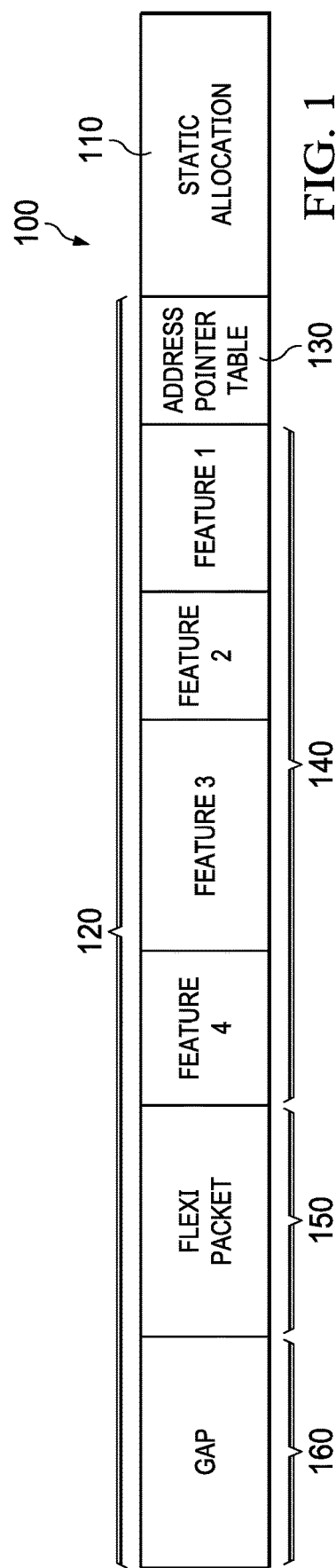
FIG. 1 illustrates an example storage scheme for trimming parameters in an eFuse memory.

For at least some ICs, calibration to compensate for component-to-component variation requires overly large and area-intensive eFuse memories and is limited to components identified for calibration during the design phase. The described examples pertain to an eFuse memory for more efficient and flexible storage of trimming parameters for components identified both in the design phase and after chip manufacture. In some examples, the disclosed eFuse memory takes up less space than other one-time write memories for trimming parameter storage. The illustrative eFuse memory is organized to include static and flexible allocation of trimming parameters. Flexible allocation enables trimming parameter variation based on current device conditions and uses the limited space of the eFuse memory efficiently to minimize the required size of the eFuse memory.

Flexible allocation of trimming parameters within eFuse memories can include an address pointer table, fixed packets of trimming parameters, and flexible packets of trimming parameters. The address pointer table indicates the starting address of fixed packets of trimming parameters for components identified for calibration during the design phase. With the address pointer table to indicate starting addresses, the fixed packets of trimming parameters need not be uniformly sized. Differently sized fixed packets of trimming parameters use space in the eFuse memory more efficiently than forced uniform sizes of packets because fixed packets including only a single trimming parameter need not be allotted the same memory space as a fixed packet including several trimming parameters corresponding to a variety of device conditions. Instead, each fixed packet takes up only the memory space it needs, and the address pointer table allows a microcontroller to look up the starting addresses of each fixed packet and navigate the eFuse memory.

In some examples, the address pointer table also includes the starting address and packet type for flexible packets of trimming parameters in the eFuse memory. Flexible packets of trimming parameters allow the eFuse memory to store trimming parameters for components identified for calibration after chip manufacture, as well as for components identified for calibration during the design phase. Several types of flexible packets can be used. One type of flexible packet includes a length section and a number of field sections equal to the value stored in the length section. Each field section includes the address of the appropriate trimming register, the trimming parameter, and the mask needed to align the trimming parameter in the trimming register.

Another type of flexible packet includes only trimming parameters and relies on operands provided to the microcontroller's firmware to indicate the appropriate trimming register and mask for each trimming parameter. This type of flexible packet leverages the uniformity of ICs manufactured from a single design to conserve space and maximize the efficiency of the eFuse memory. Every IC manufactured from the same design will require the same components to be trimmed, allowing the trimming register addresses and masks to be incorporated into the microcontroller's firmware as input operands, and conserving space within the area-intensive eFuse memory. These operands can be provided as input to the microcontroller's firmware by writing in to a set of pre-defined hardware operand registers or operand memory using any standard device interface, for example serial peripheral interface (SPI).

Another type of flexible packet allows trimming parameters to compensate for current device conditions by including fields which describe a model of the trimming parameter. The microcontroller uses the model of the trimming parameter stored in the eFuse memory and current device conditions to calculate the appropriate trimming parameter, which it stores in the trimming register and mask identified in operands provided as input operands to the microcontroller's firmware. In some cases, the flexible packet types include a second mask to compensate for default inversion between analog and digital signals. The starting addresses for each flexible packet can be included in the address pointer table along with the packet type or included in the microcontroller's firmware as an input operand.

FIG. 1 illustrates an example storage scheme 100 for trimming parameters in an eFuse memory, which allows for static and flexible allocation of trimming parameters within the memory. Section 110 is a portion of the memory dedicated to static allocation of trimming parameters and has a fixed start and end address for each trimming parameter stored within it. Static allocation connects the bits representing each trimming parameter directly to the appropriate trimming register and does not require a microcontroller to retrieve and store the trimming parameter in the appropriate trimming register. The direct connections between the trimming parameters stored in section 110 and the appropriate trimming registers are mapped during the design phase of the IC and cannot be modified after chip manufacture. The direct connection between the trimming parameter and the trimming registers also limits the trimming parameters themselves, in that the trimming parameter cannot be adjusted based on current device conditions such as temperature, Nyquist rate, or the like.

Section 120 is a portion of the eFuse memory dedicated to flexible allocation of trimming parameters and includes an address pointer table 130, a section 140 for fixed packets, a section 150 for flexible packets, and a section 160 which is left empty depending on the number and size of the trimming parameters to be stored in the eFuse memory. Section 120 is not hardwired directly to the appropriate trimming registers and a microcontroller retrieves the trimming parameters from section 120 and stores the trimming parameters in the appropriate trimming registers. To calibrate the IC using the trimming parameters, the microcontroller must know the location of each trimming parameter within the eFuse memory, the appropriate trimming register for each trimming parameter, and masks or other parameters for writing the control lines.

The intervention of a microcontroller to load the appropriate trimming register allows the trimming parameters to vary, in that multiple trimming parameters can be stored for the same component and the microcontroller selects the appropriate trimming parameter based on current device conditions. For example, the flexible allocation in section 120 may include two trimming parameters for a particular component, the first trimming parameter serving for a first Nyquist rate and the second trimming parameter serving for a second Nyquist rate. The microcontroller determines the Nyquist rate currently used by the device and selects the appropriate trimming parameter for the component to load into the appropriate trimming register.

The address pointer table 130 included in section 120 acts as a look up table for the microcontroller and contains the start addresses for each fixed packet in section 140 and the start address for section 150. In some examples, the address pointer table 130 does not include the start address for section 150, which is instead included in macro-level operating instructions for the microcontroller. Section 140 includes fixed packets, which store trimming parameters identified in the design phase of the IC. Each fixed packet includes one or more device conditions and the appropriate trimming parameter for each device condition for a particular component, or feature. The size of fixed packets need not be uniform. If one feature uses only a single trimming parameter for all device conditions, the fixed packet for that feature is smaller than the fixed packet for a feature that needs device condition dependent calibration and a set of trimming parameters to accommodate the varying device conditions. The address pointer table 130 allows different sizes of fixed packets and prevents gaps in the eFuse memory due to forced spacing and sizes of fixed packets. This in turn enables more efficient use of the eFuse memory and space in the memory for flexible packets in section 150 after chip manufacture.

Section 150 includes flexible packets, which store trimming parameters for components identified for calibration after chip manufacture. Several flexible packet types are available and section 150 can include one or more flexible packet types simultaneously, as will be described further with reference to FIGS. 2-4. Because flexible packets stored in section 150 are identified and stored after chip design, the flexible packets may not fill all the remaining space in the eFuse memory, in which case the memory includes a gap section 160. Gap section 160 can be used by other packets.

Figure 2:
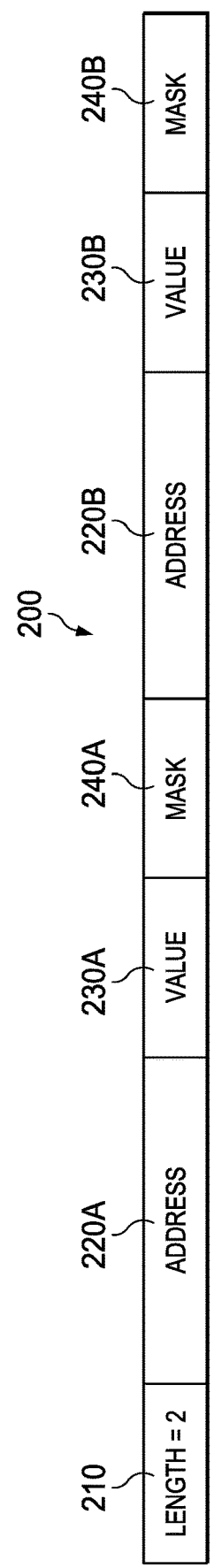
FIG. 2 illustrates an example flexible packet type for storage in an eFuse memory.

FIG. 2 illustrates an example flexible packet type 200 for storage in an eFuse memory, such as section 150 for flexible packets described herein with reference to FIG. 1. Flexible packet 200 includes a length section 210, one or more address sections 220, one or more value sections 230, and one or more mask sections 240. Length section 210 indicates the number of fields within example flexible packet 200, two in this example. Flexible packet 200 includes an address section 220, a value section 230, and a mask section 240 for each field. The address sections 220A-B indicate the addresses of the appropriate trimming registers, i.e., the trimming register to receive the corresponding value 230. For example, the address sections 220A-B indicate the address of the byte containing the appropriate trimming register. If the register spans multiple bytes, the address section 220 indicates the lowest address. The value sections 23A-B indicate the values of the trimming parameters stored in flexible packet 200. The mask sections 240A-B indicate the appropriate masks for storing the trimming parameters in the trimming registers. For example, if a trimming register occupies only part of a byte, mask section 240 indicates which bits of the byte belong to the trimming register.

The start address of flexible packet 200 can be stored as an entry in an address pointer table in the eFuse memory, such as address pointer table 130 described herein in reference to FIG. 1, or provided as an input operand to the microcontroller's operating instructions. Upon initialization of the device, the microcontroller obtains the start address of flexible packet 200, from the address pointer table or as an operand provided as an input to its own operating instructions. The microcontroller then reviews length section 210 to determine the number of fields within flexible packet 200. Once it knows the number of fields, the microcontroller can orient itself within the organizational structure of flexible packet 200 and determine which address section 220, value section 230, and mask section 240 are associated with each other. The microcontroller then loads the trimming parameter stored in section 230A to the trimming register identified in address section 220A using the mask stored in section 240A. The microcontroller also loads the trimming parameter stored in section 230B to the trimming register identified in address section 220B using the mask stored in section 240B.

Figure 3:
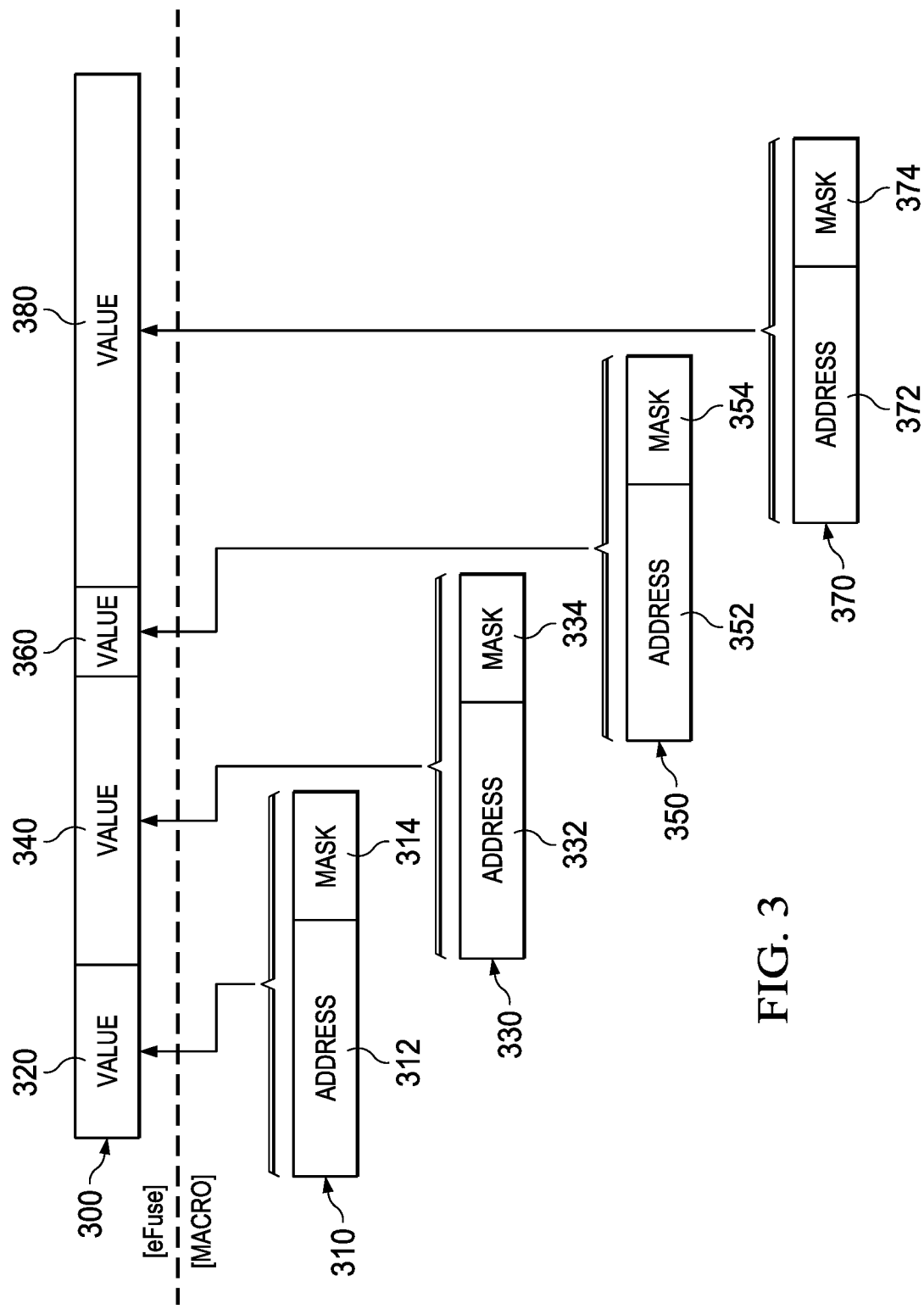
FIG. 3 illustrates another example flexible packet type for storage in an eFuse memory.

FIG. 3 illustrates another example flexible packet type 300 for storage in an eFuse memory, such as section 150 for flexible packets described herein with reference to FIG. 1. Flexible packet 300 includes value sections 320, 340, 360, and 380. Because every IC manufactured from the same design will require the same components to be trimmed, the trimming register addresses and masks are the same for every IC and can be included as input operands provided to the microcontroller's operating instructions to conserve space and maximize the efficiency of the eFuse memory. Here, the trimming register address and mask operands are combined in pairs: operand 310 includes address 312 and mask 314, operand 330 includes address 332 and mask 334, operand 350 includes address 352 and mask 354, and operand 370 includes address 372 and mask 374.

The start address of flexible packet 300 can be stored as an entry in an address pointer table in the eFuse memory, such as address pointer table 130 described herein with reference to FIG. 1, or included as an input operand provided to the microcontroller's operating instructions. Upon initialization of the device, the microcontroller obtains the start address of flexible packet 300, from the address pointer table in the eFuse memory or as an operand provided as input to its own operating instructions. The microcontroller then uses the trimming register address 312 and mask 314 contained in operand 310 to load the trimming parameter stored in value 320 to the appropriate trimming register. The microcontroller also uses the trimming register address 332 and mask 334 contained in operand 330 to load the trimming parameter stored in value 340 to the appropriate trimming register, and so on through operand 350 and value 360 and operand 370 and value 380.

Figure 4:
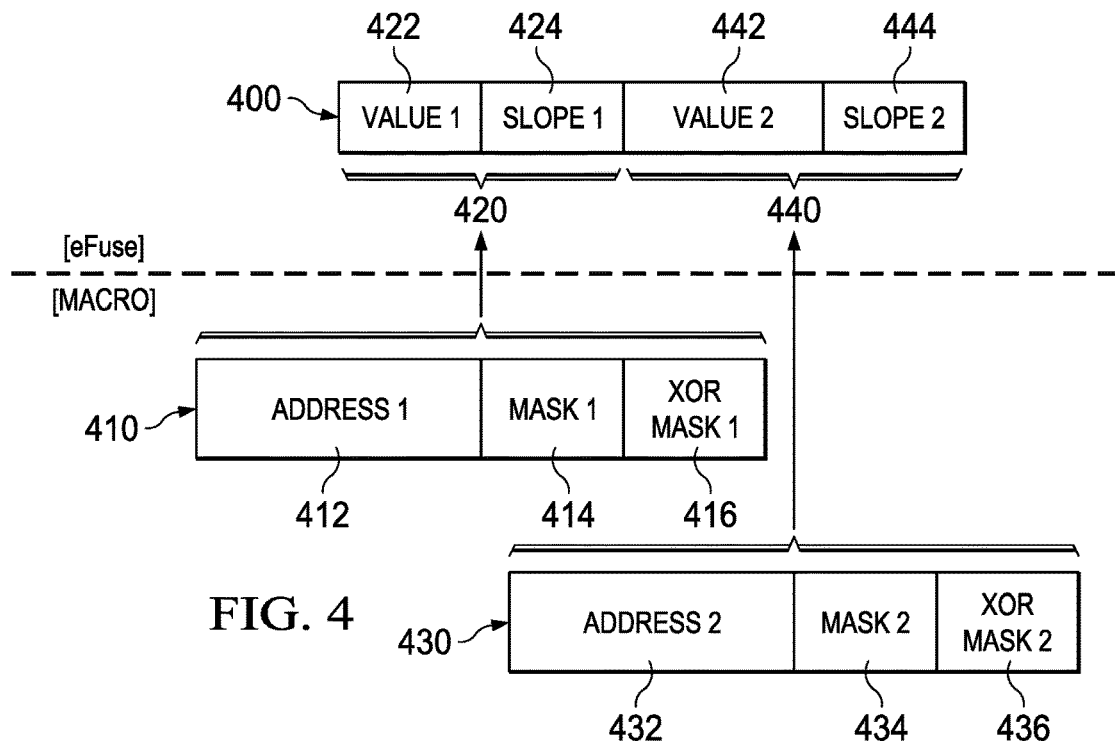
FIG. 4 illustrates another example flexible packet type for storage in an eFuse memory.

FIG. 4 illustrates another example flexible packet type 400 for storage in an eFuse memory, such as section 150 for flexible packets described herein with reference to FIG. 1. Flexible packet 400 includes fields 420 and 440. Field 420 includes value section 422 and slope section 424. Field 440 includes value section 442 and slope section 444. As described previously, some features require different calibration based on current device conditions, such as temperature, Nyquist rate, and the like. Flexible packet 400 allows the eFuse memory to include a model of the trimming parameter's variation according to current device conditions. For example, field 420 includes value section 422 and slope section 424. Value section 422 represents a y-intercept and slope section 424 represents a slope of a line fit to the trimming parameter's variation over current device conditions. While fields 420 and 440 include value sections and slope sections, the fields can be expanded in size to accommodate any number of coefficients.

As described previously, the trimming register addresses and masks are the same for every IC manufactured from the same design and can be included as input operands provided to the microcontroller's operating instructions to conserve space and maximize the efficiency of the eFuse memory. Here, the trimming register address and mask operands are combined in pairs: operand 410 includes address 412 and mask 414 and operand 430 includes address 432 and mask 434. Operands 410 and 430 each include an additional mask 416 and 436, respectively. This additional mask can be used to selectively invert bits to account for bit inversion done by an analog feature to maintain a nonzero default value, ensuring that the analog feature receives the correct value of the trimming parameter. This additional mask and its function will be described further in reference to FIG. 5.

The start address of flexible packet 400 can be stored as an entry in an address pointer table in the eFuse memory, such as address pointer table 130 described herein with reference to FIG. 1, or included as an input operand provided to the microcontroller's operating instructions. Upon initialization of the device, the microcontroller obtains the start address of flexible packet 400, from the address pointer table in the eFuse memory or as an operand provided as an input to its own operating instructions. The microcontroller then calculates the appropriate trimming parameter for field 420, using value section 422, slope section 424, and current device conditions. In some examples, the device condition is available as a sensed value (e.g., temperature), an internally computed value (e.g., noise estimator), or a value set from an external source (e.g., a desired frequency of operation). The dependence of a particular trim parameter on a particular device condition can be indicated using additional operands input to the microcontroller. For example, where the trimming parameter varies by temperature, the microcontroller calculates the appropriate trimming parameter for field 420 by multiplying the current device temperature and slope section 424 together and adding value section 422. The microcontroller then uses the trimming register address 412 and mask 414 contained in operand 410 to load the calculated trimming parameter to the appropriate trimming register. Where necessary, the microcontroller first selectively inverts the calculated trimming parameter using mask 416 in operand 410. The microcontroller does the same for operand 430 and field 440.

Figure 5:
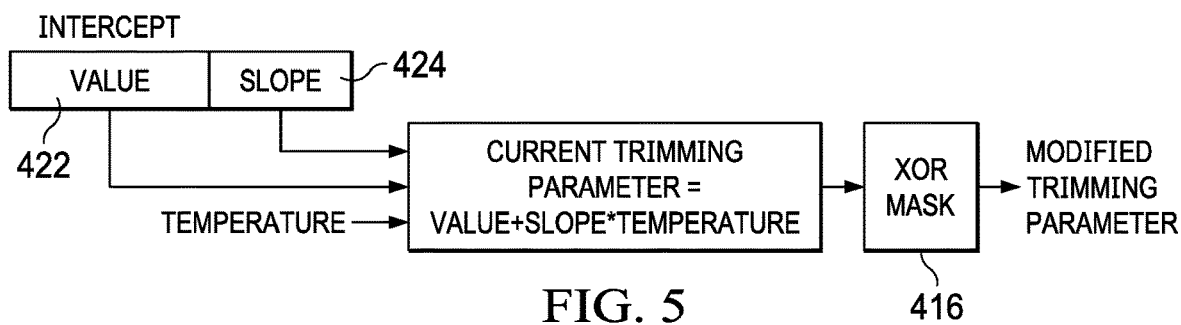
FIG. 5 illustrates the effect of including masks in the flexible packets or microcontroller operating instructions to compensate for bit inversion in the interface between analog and digital components in an IC.

FIG. 5 demonstrates the effect of including additional masks 416 and 436 in flexible packet 400 to compensate for bit inversion in the interface between analog and digital components in an IC. If the digital default value is 0000 and the analog default value is 1010, the first and third bits of every value are inverted by the interface between the digital and analog components in the IC. Thus, if a trimming parameter is 1111 as a digital signal, it becomes 0101 after the first and third bits are inverted by the interface. The analog component then receives the wrong trimming parameter and is improperly calibrated. To compensate for this bit inversion, additional masks 416 and 436 indicate the microcontroller should preemptively invert the first and third bits, such that the trimming parameter becomes 0101 as a digital signal and when inverted again by the interface, becomes 1111 as an analog signal. The analog component then receives the correct trimming parameter and is properly calibrated.

To illustrate, a microcontroller obtains value section 422 and slope section 424 from flexible packet 400 in the eFuse memory and current device temperature from a temperature sensor. The microcontroller then calculates the trimming parameter by multiplying the device temperature and slope section 424 together and adding value section 422. The microcontroller then applies the XOR mask 416 to the calculated trimming parameter, resulting in a modified trimming parameter. The microcontroller then loads the modified trimming parameter to the appropriate trimming register indicated by address 412 and mask 414. In the process of doing so, the modified trimming parameter will be inverted by the interface between the digital and analog components, undoing the inversion from XOR mask 416 and resulting in the calculated trimming parameter being loaded to the trimming register. This ensures the analog component is properly calibrated using the correct trimming parameter.

Figure 6:
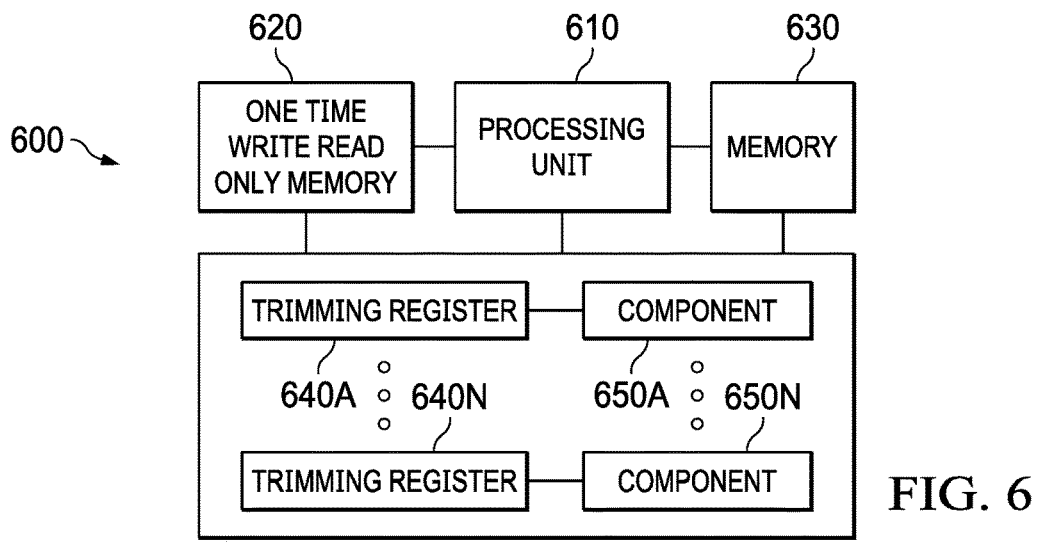
FIG. 6 illustrates an example system including an eFuse memory.

FIG. 6 illustrates an example system 600 including one time write read only memory. Example system 600 includes a processing unit 610, a one-time write read-only memory 620, a memory 630, and a set of N trimming registers 640A-N and components 650A-N. Processing unit 610 can be one or more processing cores of any type, including central processing units, digital signal processors, application specific integrated circuits, and the like. One-time write read-only memory 620 can be an eFuse memory and stores trimming parameters for calibrating components 650A-N according to any of the processes described herein. Memory 630 can be any appropriate storage medium, such as a static random access memory (SRAM), and can be used to store instructions for processing unit 610. Processing unit 610 stores trimming parameters in one-time write read-only memory 620 in the set of trimming registers 640A-N by any of the processes as described herein. Each trimming register 640 is connected to a component 650 and the trimming parameter loaded in a particular trimming register 640A is used to calibrate component 650A.

In this description, the term "couple" or "couples" means either an indirect or direct connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

The invention claimed is:

1. An apparatus, comprising:
a processing unit;
a memory comprising one or more flexible packets; and
one or more computer-readable storage devices storing machine instructions which,
when executed by the processing unit, cause the processing unit to:
obtain trimming instructions for a component;
look up a trimming parameter for the component in the memory; and
load the trimming parameter in a trimming register;
wherein the trimming instructions include a trimming register address and a mask and wherein when executed by the processing unit, the machine instructions cause the processing unit to load the trimming parameter in the trimming register indicated by the trimming register address using the mask.

2. The apparatus of claim 1, wherein the trimming instructions further include an additional mask and wherein when executed by the processing unit, the machine instructions cause the processing unit to load the trimming parameter in the trimming register indicated by the trimming register address using the mask and the additional mask.

3. The apparatus of claim 2, wherein the additional mask compensates for bit inversion by an interface between one or more digital components and one or more analog components in an integrated circuit.

* * * * *